United States Patent [19]

Burnham et al.

[11] 4,184,170
[45] Jan. 15, 1980

[54] LIGHT EMITTING DIODE

[75] Inventors: Robert D. Burnham, Los Altos Hills; Donald R. Scifres, Los Altos; Eric G. Rawson, Saratoga, all of Calif.

[73] Assignee: Xerox Corporation, Stamford, Conn.

[21] Appl. No.: 937,010

[22] Filed: Aug. 25, 1978

Related U.S. Application Data

[63] Continuation of Ser. No. 786,169, Feb. 11, 1977, abandoned.

[51] Int. Cl.$^2$ .............................................. H01L 33/00
[52] U.S. Cl. ........................................ 357/17; 357/18; 357/16; 331/94.5 H
[58] Field of Search ............................. 357/18, 17, 16; 331/94.5 H

[56] References Cited
U.S. PATENT DOCUMENTS

| | | | |
|---|---|---|---|
| 4,016,505 | 4/1977 | Itoh | 331/94.5 H |
| 4,077,019 | 2/1978 | Streifer | 331/94.5 H |
| 4,132,960 | 2/1979 | Streifer | 331/94.5 H |

Primary Examiner—Martin H. Edlow
Attorney, Agent, or Firm—Leonard Zalman

[57] ABSTRACT

An LED in which the recombination region is comprised of a first layer which is degenerately doped ($\approx 10^{19}/\text{cm}^3$) and a second layer which is less degenerately doped ($\approx 3 \times 10^{18}/\text{cm}^3$). The reduced doping of the second layer provides a depletion region which is wider than the depletion region of conventional LED's whereby carrier tunneling (and non-radiative recombination from such tunneling) is reduced. The second layer is only as thick as necessary ($\approx 150$Å) to reduce tunneling (excess current) significantly which permits substantial radiation by improved carrier injection into the first (heavily doped) portion. The heavy doping of the first layer allows the LED to respond very quickly to switching signals whereby improved light output is achieved with a great reduction in non-radiative recombination due to tunneling.

2 Claims, 6 Drawing Figures

LIGHT EMITTING DIODE

This is a continuation of application Ser. No. 786,169, filed Feb. 11, 1977, now abandoned.

BACKGROUND OF THE INVENTION

High switching rate (>200 MHz) light emitting diode sources appear quite promising for many fiber-optic communication applications. Light emitting diodes operating in the spontaneous mode (LED's) instead of the stimulated mode (laser diodes) can perform quite satisfactorily even though decreased output powers and decreased speeds are inherent. LED's are cheaper to make and have much longer operating lives than laser diodes.

It is well known that the lifetime of injected carriers in an LED decreases as the doping concentration of the active region increases and that decreased lifetime of injected carriers allows the LED to respond more quickly to switching signals thereby permitting high speed operation. Accordingly, prior art LED's have heavily doped ($\approx 10^{19}/cm^3$) active regions. Unfortunately, the internal quantum efficiency of LED's also decreases with increased doping concentration. For example, as doping concentration increases the width of the depletion region decreases, resulting in carrier tunneling across the depletion region. The tunneling makes use of local band gap states due to imperfections and hence is a non-radiation producing recombination.

OBJECTS OF THE INVENTION

It is an object of the present invention to provide an improved LED.

It is another object of the present invention to provide an improved LED capable of high speed switching.

It is a further object of the present invention to provide an improved LED having reduced non-radiative carrier recombination.

SUMMARY OF THE INVENTION

In accordance with the invention, the recombination region of an LED is comprised of a first layer which is heavily ($\approx 10^{19}/cm^3$) doped and a second layer which is less heavily doped ($\approx 3 \times 10^{18}/cm^3$). The reduced doping of the second layer provides a depletion region which is wider than the depletion region of conventional LED's whereby carrier tunneling (and non-radiative recombination from such tunneling) is reduced. The second layer is only as thick as necessary ($\approx 150$ Å) to reduce tunneling (excess current) significantly which permits substantial radiation producing carrier recombination to occur in the first (heavily doped) portion. The heavy doping of the first layer allows the LED to respond very quickly to switching signals whereby high speed operation is achieved with a great reduction in non-radiative recombination due to tunneling.

In one embodiment of the invention, a dopant which does not diffuse readily into GaAs is used for doping both the first and second layers of the recombination region. In another embodiment of the invention, a dopant that does not diffuse readily into the base material of the recombination region is used for doping the second layer to provide a non-diffusing rectifying junction and a dopant that diffuse readily into the base material of the recombination region is used for doping the first layer.

DETAILED DESCRIPTION OF THE INVENTION

Figure 1:
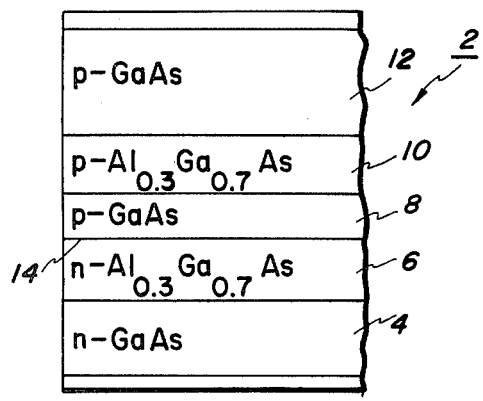
FIG. 1 is a sectional diagram of an LED of the prior art.

Referring to FIG. 1, there is shown a cross-section diagram of a conventional double heterostructure solid state LED device 2 presently used as a high speed (200 MHz) source for fiber optic communications. Device 2 includes a substrate 4, a first layer 6, a recombination region or layer 8, a second layer 10, and a contact-facilitating layer 12. The substrate and layers of the device 2 can be of the materials shown and can be doped as shown to provide a rectifying junction 14 between layers 6 and 8. Contacts are provided on substrate 4 and layer 12 to permit a forward bias voltage to be impressed across the junction 14. The recombination layer 8 is on the order of one (1) micron thick and is heavily ($10^{19}/cm^3$) doped with a dopant that does not diffuse readily into the base material of the layer 8. Conventionally, the material of layer 8 is GaAs and the dopant used for that material is germanium since germanium does not diffuse readily into GaAs or GaAlAs. Because germanium does not diffuse readily into GaAlAs, the rectifying junction 14 is very abrupt. Since the rectifying junction 14 is very abrupt and since the recombination layer 8 is heavily (degenerately) doped, excess non-radiative tunneling occurs.

Figure 2:
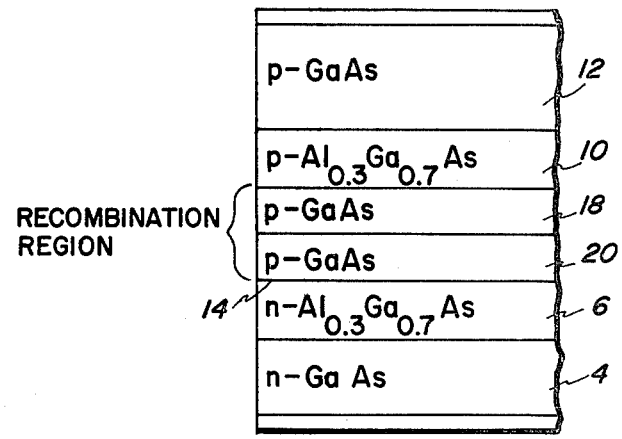
FIG. 2 is a sectional diagram of an LED in accordance with the invention.

In accordance with the invention, non-radiative tunneling is decreased, that is, current injection is improved, by having the recombination region comprised of two different layers. Referring to FIG. 2, the LED of the invention includes layers 4, 6, 10 and 12 (corresponding to layers 4, 6, 10 and 12 of the prior art device of FIG. 1) and a recombination region comprised of layers 18 and 20. Layer 18 is on the order of one micron thick and is very heavily (degenerately) doped to a level of approximately $10^{19}/cm^3$ with a dopant that does not diffuse readily in GaAs and GaAlAs. A suitable dopant is germanium when the base material of layer 18 is GaAs. In accordance with the invention, the layer between layers 6 and 18, that is, layer 20, is less degenerately doped ($\approx 3 \times 10^{18}/cm^3$) than layer 18. The lighter doping of layer 18 gives the device of FIG. 2 a wider depletion region adjacent to the rectifying junction 14 than that of the prior art device of FIG. 1, whereby tunneling is decreased and current injection is improved.

The switching speed of the LED of FIG. 2 should be governed mostly by degenerately doped layer 18. This criteria indicates that the less degenerately doped layer 20 should be made as thin as possible and have a thickness only sufficient to reduce tunneling (excess) current significantly. If indeed tunneling is the mechanism for excess current then a thickness of approximately 150 Å for layer 20 will signficantly reduce or eliminate excess current.

Figure 5A:
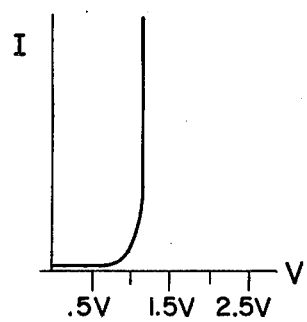
FIGS. 5A and 5B are I–V characteristics of the prior art and FIG. 2, respectively.
Figure 5B:
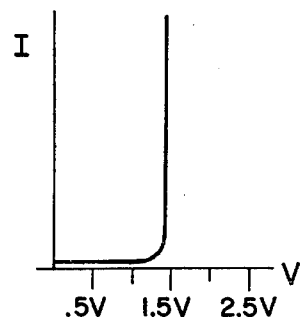

Referring now to FIGS. 5A and 5B, FIG. 5A shows a I–V characteristic for an LED of the prior art and FIG. 5B shows a I–V characteristic for the LED of FIG. 2. It is noted that the prior art LED starts drawing current much earlier in voltage and this is the excess, non-radiation producing current. The LED having the I-V characteristic of FIG. 5B was grown such that layer 18 was about twice as thick as layer 20. It is believed that layer 20 should be made as thin as possible so that the less degenerately doped layer 20 does not decrease the speed of the LED. The speed of the LED should be governed mainly by degenerately doped layer 18. Further regarding doping levels, satisfactory operation is achieved with substrate 4 and layers 10 and 12 heavily doped ($>10^{18}/cm^3$) and with layer 6 lightly doped ($<10^{17}/cm^3$). An additional heavily doped layer of GaAlAs between substrate 4 and layer 6 might also be helpful to reduce the resistance. The additional layer would allow layer 6 to be as thin as layer 20 ($\approx 150$ Å).

Figure 3:
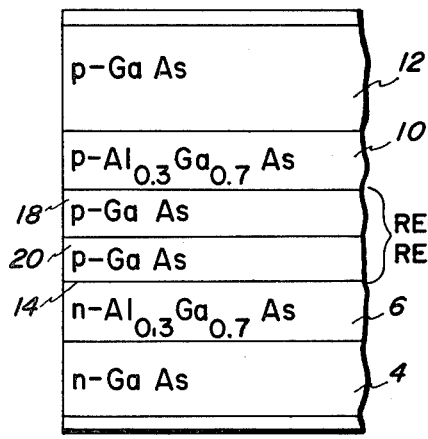
FIGS. 3 and 4 are sectional diagrams of other LED's in accordance with the invention.

Germanium can be used as the dopant for layers 18 and 20 because germanium does not diffuse readily in GaAs and that simplifies device fabrication. A different shallow acceptor such as Zn, Mg or Cd may actually be better for high speed switching. However, Zn, Mg and Cd diffuse readily in GaAs and GaAlAs and may create problems when making degenerately doped recombination region. FIG. 3 shows an improved LED in which the layer 20 is doped with a material which does not diffuse readily in GaAs and GaAlAs and the layer 18 is doped with a material that diffuses readily in GaAs and GaAlAs. For example, when the base material of layers 18 and 20 is GaAs, layer 18 can be doped with Zn or Cd to a level of $\approx 10^{19}/cm^3$ and layer 20 can be doped with Ge to a level of $\approx 3 \times 10^{18}/cm^3$. Care should be taken that the dopant used for layer 18 does not diffuse through layer 20 and totally compensate any part of layer 6.

Figure 4:
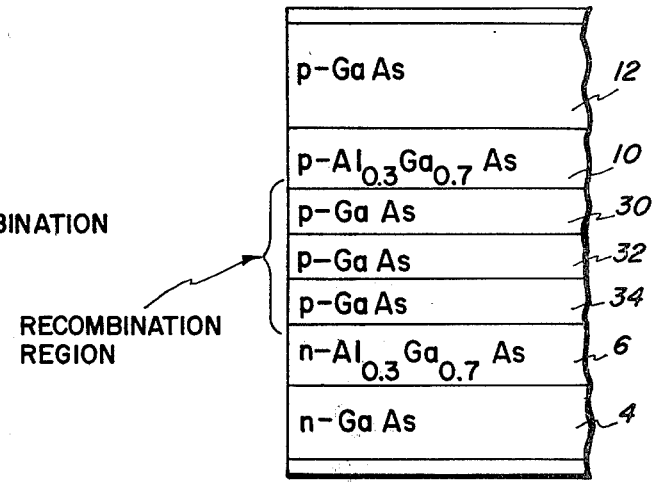

FIG. 4 shows an LED structure that keeps the layer 18 dopant from diffusing all the way to layer 6. In the LED of FIG. 4, the recombination region is comprised of three layers, a first layer 30 degenerately doped ($\approx 10^{19}/cm^3$) with a material that diffuses readily in the base material of layer 30, a second layer 32 degenerately doped ($\approx 10^{19}/cm^3$) with a material that does not diffuse readily in the base material of layer 32, and a third layer 34 less degenerately doped ($\approx 3 \times 10^{18}/cm^3$) with a material that does not diffuse readily in the base material of layer 34. If the recombination region is GaAs, layer 30 can be doped with Zn, Mg or Cd and layers 32 and 34 can be doped with Ge. The LED of FIG. 4 keeps the dopant of layer 30 from diffusing all the way into layer 6 and still allows less degenerately doped layer 34 to be made thin.

The LED's of FIGS. 2, 3 and 4 can be made by standard liquid phase epitaxy or molecular beam epitaxy growth techniques. By either method, the layer 6 is grown first on substrate 4, followed by the growth of the layers of the recombination region, followed by the growth of layers 10 and 12. As an example, layer 20 in FIGS. 2 and 3 and layer 34 in FIG. 4 were doped $\approx 3 \times 10^{18}/cm^3$. For optimum injection it might be better to slightly increase the dopant concentration or significantly reduce the dopant concentration to $\approx 3 \times 10^{17}/cm^3$ or even less.

Lateral injected carrier spreading in the active region plays a very important role as to how thick the active region should be. This spreading is dependent upon injected carriers/$cm^3$ and the carrier mobility in the active region. The better the lateral carrier confinement the thinner the active region can be made. Optimum thicknesses of the active region could vary from several microns to less than a tenth of a micron depending upon device geometry and active region doping.

Much attention has been focused on the fact that the p-type impurity in layer 20 of FIG. 3, layers 34 and 32 of FIG. 4, does not diffuse readily. This is only true if the growth process involves high temperatures. Growth of heterostructure LED by molecular beam epitaxy or by organo-metallics can be achieved at relatively low temperatures (below 600° C.). For low temperature growth situations the p-type dopant adjacent to the p-n junction could conceivably be Zn, Mg, or Cd since their ability to diffuse would be suppressed. Also, the example above discussed growing various layers. When one grows by vapor techniques, the growth of layers 18 and 20 may involve a simple impurity concentration grading process.

We claim:

1. A light emitting diode capable of having a high switching rate and reduced non-radiative recombination due to tunneling comprising:

an active recombination region of a first semiconductor material containing group III-V elements, said active recombination region being bordered by at least one layer of a second semiconductor material containing group III-V elements, said second semiconductor material having a lower refractive index than the refractive index of said first semiconductor material, said active recombination region and said one layer being doped to have opposite conductivity types whereby a rectifying junction is provided therebetween, radiative recombination of oppositely charged carriers taking place in said active recombination region when said rectifying junction is forward biased beyond threshold;

said active recombination region being comprised of a plurality of contiguous layers, one of said layers of said active recombination region being degenerately doped to a level of at least approximately $10^{19}/cm^3$ with a dopant that diffuses readily in both said first material and said second material, said one layer of said active recombination region being separated from said rectifying junction by another of said layers of said active recombination region, said another layer of said active recombination region being less than degenerately doped with a dopant that does not diffuse readily in both said first material and said second material, whereby non-radiative recombination of oppositely charged carriers due to carrier tunneling is reduced.

2. A light emitting diode capable of having a high switching rate and reduced non-radiative recombination due to tunneling comprising:

an active recombination region of a first semiconductor material containing group III-V elements, said active recombination region being bordered by at least one layer of a second semiconductor material containing group III-V elements, said second semiconductor material having a lower refractive index than the refractive index of said first semiconductor material, said active recombination region and said one layer being doped to have opposite conductivity types whereby a rectifying junction is provided therebetween, radiative recombination of oppositely charged carriers taking place in said recombination region when said rectifying junction is forward biased beyond threshold, said active recombination region being comprised of a plurality of contiguous layers, one of said layers of said active recombination region being degenerately doped to a level of at least approximately $10^{19}/cm^3$ with a dopant that diffuses readily in both said first material and said second material, said one layer of said active recombination region being separated from said rectifying junction by at least two other layers of said active recombination region, the layer of said at least two other layers closest to said first layer of said active recombination region being degenerately doped to a level of at least approximately $10^{19}/cm^3$ with a dopant that does not diffuse readily in both said first material and said second material, the layer of said at least two other layers of said active recombination region further from said first layer of said active recombination region being less than degenerately doped with a dopant that does not diffuse readily in both said first material and said second material, whereby non-radiative recombination of oppositely charged carriers due to carrier tunneling is reduced.

* * * * *